(12) United States Patent
Ogata et al.

(10) Patent No.: US 10,367,583 B2
(45) Date of Patent: Jul. 30, 2019

(54) DRIVER CIRCUIT, OPTICAL TRANSMISSION MODULE AND OPTICAL TRANSMISSION DEVICE

(71) Applicant: FUJITSU LIMITED, Kawasaki-shi, Kanagawa (JP)

(72) Inventors: Yuuki Ogata, Kawasaki (JP); Toshihiko Mori, Isehara (JP); Yasufumi Sakai, Fuchu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/969,818

(22) Filed: May 3, 2018

(65) Prior Publication Data

US 2018/0337732 A1    Nov. 22, 2018

(30) Foreign Application Priority Data

May 17, 2017  (JP) ................................. 2017-098324

(51) Int. Cl.
| | | |
|---|---|---|
| *H04B 10/40* | (2013.01) | |
| *H04B 10/50* | (2013.01) | |
| *F21V 8/00* | (2006.01) | |
| *H04B 10/80* | (2013.01) | |
| *H01S 5/042* | (2006.01) | |
| *H01S 5/183* | (2006.01) | |

(52) U.S. Cl.
CPC ........... *H04B 10/40* (2013.01); *G02B 6/0006* (2013.01); *H01S 5/042* (2013.01); *H04B 10/504* (2013.01); *H04B 10/505* (2013.01); *H04B 10/808* (2013.01); *H01S 5/183* (2013.01)

(58) Field of Classification Search
CPC ......................... H04B 10/40; H04B 10/50–508
See application file for complete search history.

(56) References Cited

U.S. PATENT DOCUMENTS

| | | | |
|---|---|---|---|
| 2010/0183318 A1* | 7/2010 | Tanaka ..................... H01S 5/042 398/201 |
| 2017/0025816 A1* | 1/2017 | Tanaka ................. H04B 10/504 |
| 2018/0294886 A1* | 10/2018 | Coue .................... H01S 5/06832 |
| 2019/0069147 A1* | 2/2019 | Charlton ................. H04L 51/20 |

FOREIGN PATENT DOCUMENTS

JP     2000-124862     4/2000

* cited by examiner

*Primary Examiner* — Nathan M Cors
(74) *Attorney, Agent, or Firm* — Fujitsu Patent Center

(57) ABSTRACT

There is provided a driver circuit including a variable current-source configured to include, a first current-source coupled to a first input node to which a first signal is input from an external, a second current-source coupled to a second input node to which a second signal as an inversion of the first signal is input from the external, a first bypass circuit coupled between the first current-source and the first input node, the first bypass circuit being switched according to the second signal, and a second bypass circuit coupled between the second current-source and the second input node, the second bypass circuit being switched according to the first signal, and a terminal circuit configured to be terminated for an optical device driven by a drive signal according to the first signal, the drive signal being output from an output node coupled between the terminal circuit and the variable current-source.

12 Claims, 14 Drawing Sheets

SIMPLIFIED MODEL OF DEFINED VCSEL
(SEMICONDUCTOR LASER)

VCSEL
(SIMPLIFIED MODEL)

I-V CHARACTERISTIC EXAMPLE OF VCSEL
(SEMICONDUCTOR LASER)

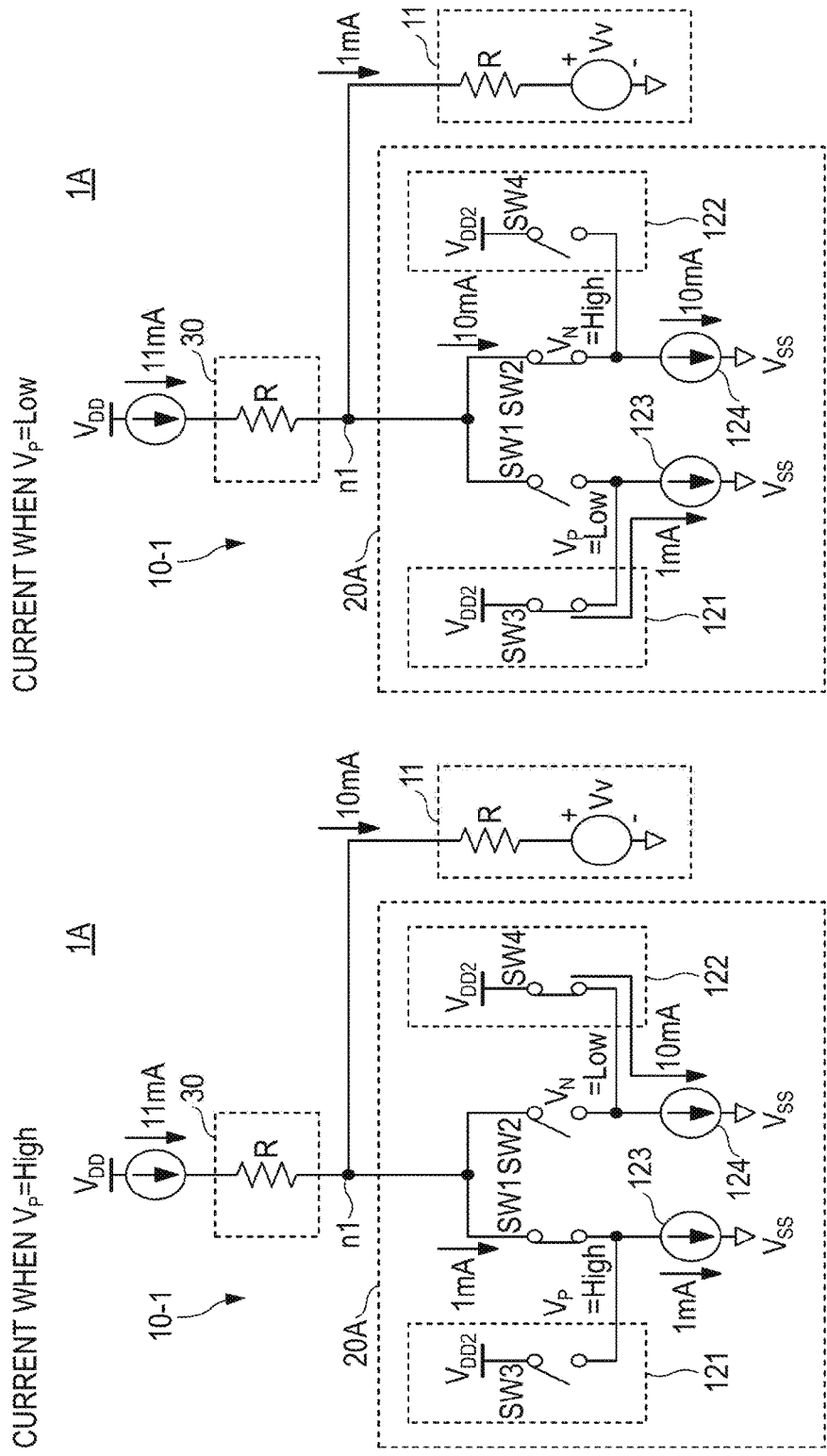

WHEN RESISTANCE ELEMENT IS CONNECTED IN SERIES TO CURRENT SOURCE

WHEN RESISTANCE ELEMENT IS CONNECTED IN PARALLEL TO CURRENT SOURCE

DRIVER CIRCUIT, OPTICAL TRANSMISSION MODULE AND OPTICAL TRANSMISSION DEVICE

CROSS-REFERENCE TO RELATED APPLICATION

This application is based upon and claims the benefit of priority of the prior Japanese Patent Application No. 2017-098324, filed on May 17, 2017, the entire contents of which are incorporated herein by reference.

FIELD

The embodiments discussed herein are related to a driver circuit, and an optical transmission module and an optical transmission device which are including the driver circuit.

BACKGROUND

High-speed and high-capacity transmission is required at a distance of several meters to several tens of meters, for example, between servers in a data center, and between devices of a large scale computer (supercomputer) network. In optical communication, a transmission rate of 25 Gbps (gigabit per second) and a transmission capacity of 100 Gbps (25 Gbps×4) are realized, and data transmission between devices is transitioning from an electrical communication to an optical communication.

For the optical transmission between devices or between processors, active optical cables are used instead of electrical cables. An active optical cable is an optical transceiver in which an E/O (Electrical-to-Optical) conversion module for converting an electrical signal into an optical signal, an optical fiber for transmitting an optical signal and an O/E (Optical-to-Electrical) conversion module for returning the optical signal received from the optical fiber to an electrical signal are integrated. A connector part of the active optical cable connected to a computer is compatible with a connector of the conventional electric cable. High-speed and large-capacity transmission by optical communication becomes possible merely by connecting the active optical cable instead of the electric cable to the computer.

A VCSEL (Vertical Cavity Surface Emitting Laser), which is low in cost and power consumption, is being widely used as a light emitting element in an E/O module. A CML (Current Mode Logic) driver is used to drive a light emitting element such as a VCSEL at a high speed in optical transmission of a relatively short distance. A CML is used in a differential high-speed interface because its configuration is simple and its rise/fall speed (edge rate) is high.

A technique has been known that the output of a differential amplifier is returned by a current mirror circuit so that the final stage transistor is operated at a high speed, the power supply voltage is lowered without deteriorating an optical output waveform, and the power consumption is reduced.

Related technologies are disclosed in, for example, Japanese Laid-Open Patent Publication No. 2000-124862.

SUMMARY

According to an aspect of the invention, a driver circuit having a differential input and a single-ended output, the driver circuit includes a variable current source configured to include, a first current source coupled to a first input node to which a first signal is input from an external, a second current source coupled to a second input node to which a second signal as an inversion of the first signal is input from the external, a first bypass circuit coupled between the first current source and the first input node, the first bypass circuit being switched according to the second signal, and a second bypass circuit coupled between the second current source and the second input node, the second bypass circuit being switched according to the first signal, and a terminal circuit configured to be terminated for an optical device driven by a drive signal according to the first signal, the drive signal being output from an output node coupled between the terminal circuit and the variable current source.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A and 4B are schematic views of an E/O converter of a First Embodiment;

DESCRIPTION OF EMBODIMENTS

A differential transmission including the CML adopts a differential input and differential output configuration. In this configuration, one differential output is connected to an optical device to be driven and the other differential output is connected to a dummy optical device. When a differential input/single-ended output driver that does not require a dummy circuit can be made, the current consumption should be further reduced.

Hereinafter, an embodiment of a technique capable of driving an optical active cable with low current consumption will be described with reference to the accompanying drawings.

Figure 1A:
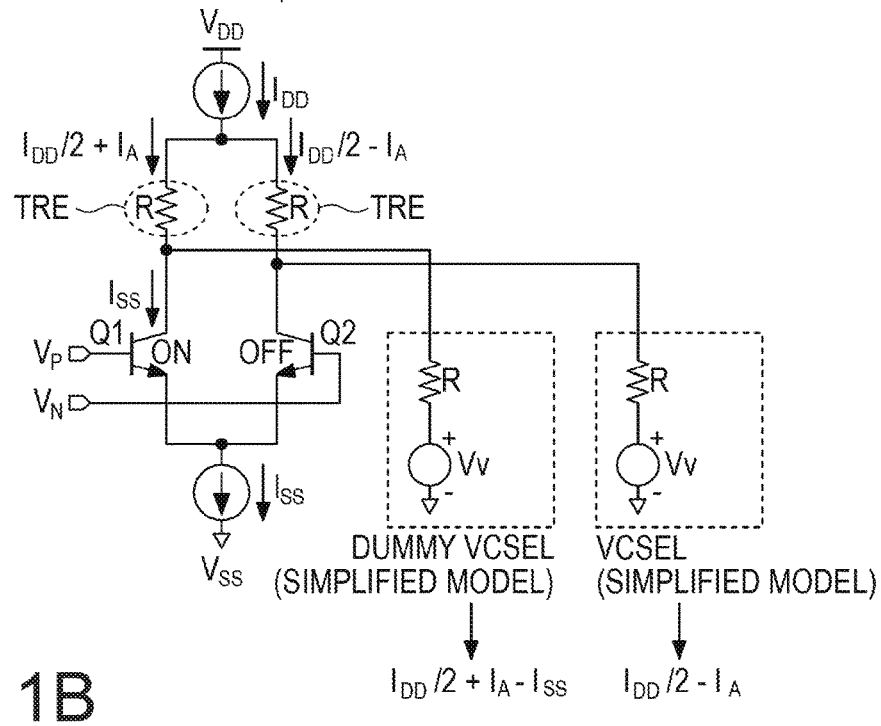
FIGS. 1A and 1B are views for explaining a current amount in a general differential driving configuration.
Figure 1B:
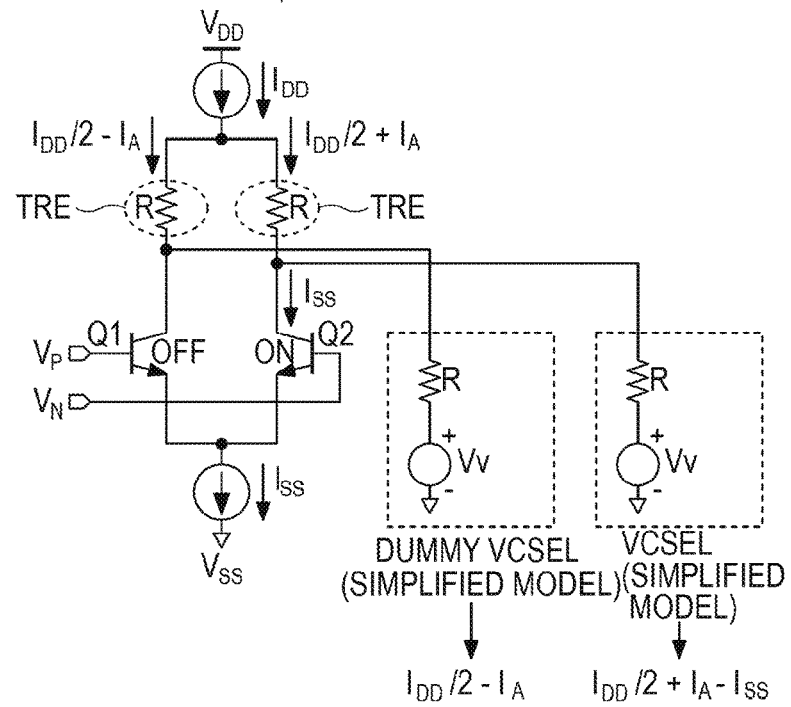

FIGS. 1A and 1B are views for explaining a current amount in a general differential input/differential output configuration. As an example, a case of driving a VCSEL with a CML driver is considered. In the CML driver, two paths are connected in parallel between the power supply voltages $V_{DD}$ (or Vcc) and $V_{SS}$ (or Vee), and a terminating resistance element TRE and a transistor are connected in series in each path. Data signals $V_P$ and $V_N$ of opposite phases are input to the bases of the corresponding transistors Q1 and Q2, respectively. An output is withdrawn from a node between the collector of each transistor and the terminating resistance element TRE. One output is connected to the input of the VCSEL and the other output is connected to the input of a dummy VCSEL.

FIG. 1A illustrates a current state when $V_P$ is at a high potential (High), and FIG. 1B illustrates a current state when VP is at a low potential (Low). In FIG. 1A, a transistor Q1 is in an ON state and a transistor Q2 is in an OFF state. A current flowing through a current source on the $V_{DD}$ side is denoted by $I_{DD}$ and a current flowing through a current source on the $V_{SS}$ side is denoted by $I_{SS}$. It is assumed that a current difference $I_A$ is generated between the transistors Q1 and Q2 by an ON/OFF operation.

A current of $I_{DD}/2+I_A$ flows through the terminating resistance element TRE connected to the transistor Q1 in the ON state. A current of $I_{DD}/2-I_A$ flows through the terminating resistance element TRE connected to the transistor Q2 in the OFF state. Since no current flows between the collector and the emitter of the transistor Q2, a current amount of $I_{DD}/2-I_A$ flows through the VCSEL connected to this path. Since $I_{SS}$ of the $V_{SS}$ side current source flows as a collector current through the transistor Q1 in the ON state, a current amount of $I_{DD}/2+I_A-I_{SS}$ flows through the dummy VCSEL.

In FIG. 1B, the transistor Q1 is in an OFF state and the transistor Q2 is in an ON state. A current of $I_{DD}/2-I_A$ flows through the terminating resistance element TRE connected to Q1 in the OFF state and a current of $I_{DD}/2+I_A$ flows through the terminating resistance element TRE connected to Q2 in the ON state. Since no current flows between the collector and the emitter of the transistor Q1 in the OFF state, a current amount of $I_{DD}/2-I_A$ flows through the dummy VCSEL connected to this path. Since $I_{SS}$ of the $V_{SS}$ side current source flows as a collector current of the transistor Q2 in the ON state, a current amount of $I_{DD}/2+I_A-I_{SS}$ flows through the VCSEL.

Figure 2A:
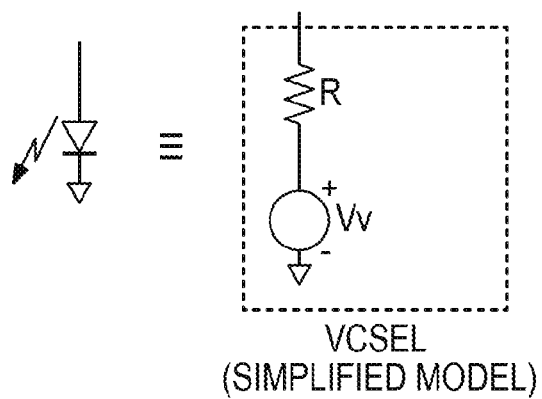
FIGS. 2A and 2B are views defining a model of VCSEL of FIGS. 1A and 1B.
Figure 2B:
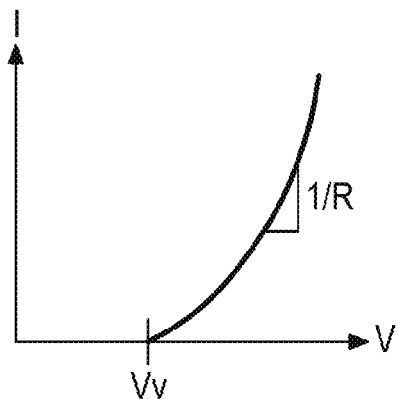

FIGS. 2A and 2B are views defining a model of the VCSEL of FIGS. 1A and 1B. In FIG. 2A, a simplified model (an equivalent circuit) of a semiconductor laser such as a VCSEL is defined by a resistance R and a threshold voltage Vv. The threshold voltage Vv is a threshold voltage at which a current starts to flow in the VCSEL. The resistance R is a differential resistance of the VCSEL as seen from a differential driver in a state where a current flows through the VCSEL. FIG. 2B illustrates the current-voltage characteristics of the semiconductor laser. When the horizontal axis represents a voltage V and the vertical axis represents a current I, the slope of the current-voltage characteristics is expressed as 1/R.

It is here assumed that the threshold voltage Vv applied to the VCSEL and the differential resistance R are constant without depending on the amount of current flowing in the VCSEL. It is also assumed that the resistance value of the terminating resistance element TRE is substantially equal to the differential resistance value of the VCSEL, as expressed by the following equation (1).

$$R(I_{DD}/2+I_A)+R(I_{DD}/2+I_A-I_{SS}) \approx R(I_{DD}/2-I_A)+R(I_{DD}/2-I_A) \quad (1)$$

The first term on the left side of the equation (1) represents to a voltage drop at the terminating resistance element TRE connected to the transistor Q1 in the ON state in FIG. 1A and the second term represents a voltage applied to the dummy VCSEL. The first term on the right side represents a voltage drop at the terminating resistance element TRE connected to the transistor Q1 in the OFF state in FIG. 1B and the second term represents a voltage applied to the dummy VCSEL. From the equation (1), $I_A \approx I_{SS}/4$.

The amount of current flowing through the VCSEL when $V_P$ is at a high potential (High), $$I_{DD}/2-I_A = I_{DD}/2-I_{SS}/4 \quad (2)$$

The amount of current flowing through the VCSEL when $V_P$ is at a low potential (Low), $$I_{DD}/2+I_{SS} = I_{DD}/2-I_{SS} \times 3/4 \quad (3)$$

As an example, in a design in which a current of 10 mA flows through the VCSEL when the input data $V_P$ of the differential driver is at a high potential (High) and a current of 1 mA flows through the VCSEL when the $V_P$ is at a low potential (Low), when a current amount is applied to the equations (2) and (3), $$I_{DD}/2-I_{SS}/4 = 10 \text{ mA} \quad (4)$$

$$I_{DD}/2 = I_{SS} \times 3/4 = 1 \text{ mA} \quad (5).$$

From the equations (4) and (5), $I_{DD}=29$ mA, $I_{SS}=18$ mA, and the current consumption of the differential driver is 29 mA. When a differential input/single-ended output driver that does not require a dummy circuit can be made, the current consumption of the driver should be further reduced.

Figure 3:
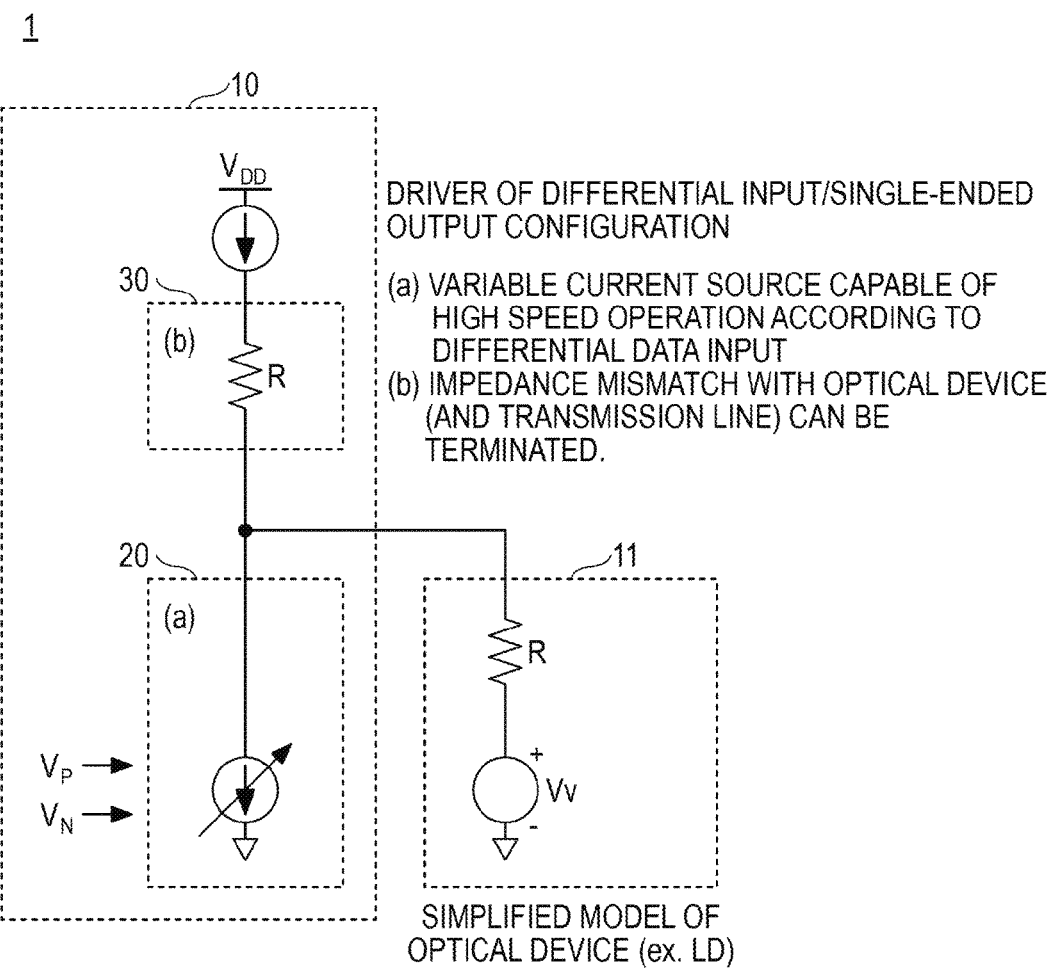
FIG. 3 is a view for explaining objects to be taken into consideration in order to implement a driver with a differential input/single-ended output configuration.

FIG. 3 is a view for explaining objects to be taken into consideration in order to implement a driver with a differential input/single-ended output configuration. An E/O converter 1 includes a driver circuit 10 of differential input/single-ended output and an optical device 11 driven by the driver circuit 10. The E/O converter 1 may be applied to an optical transmission module as a transmission front end. The optical device 11 is a light emitting device such as, for example, a Fabry-Perot laser, a quantum well semiconductor laser, a distributed feedback (DFB) laser, or a VCSEL, and is represented by the same simplified model as in FIGS. 2A and 2B.

The driver circuit 10 includes a terminal circuit 30 connected to a power supply voltage $V_{DD}$ and a variable current source 20 connected in series to the terminal circuit 30. In order to implement a differential input/single-ended output driver, the embodiment achieves the following two objects.

(a) The variable current source 20 is capable of high-speed operation according to differential data input.
(b) The terminal circuit 30 should be able to terminate impedance mismatch with the optical device (and transmission line).

The object (a) is to implement a circuit capable of high-speed switching according to the logical values of the differential data $V_P$ and $V_N$ so that a transmission rate of several tens of Gbps may be implemented. The object (b) is to match the resistance R of the optical device 11 and the resistance R of the terminal circuit 30 by setting the output of the driver circuit 10 to a single-ended. When the driver circuit 10 has a single-ended output, a one-way current path is formed up to the optical device 11 and the impedance of $V_{DD}$ appears dominant from the optical device 11. Therefore, the configuration of the terminal circuit 30 is devised to match the impedance on the $V_{DD}$ side to the characteristic impedance of the optical device 11 and the transmission line.

First Embodiment

FIGS. 4A and 4B illustrate a configuration example of an E/O converter 1A of a First Embodiment. The First Embodiment implements a variable current source capable of high-speed operation according to differential data input. FIG. 4A illustrates a current state when an input $V_P$ is at a high potential (High) and FIG. 4B illustrates a current state when the input $V_P$ is at a low potential (Low).

The E/O converter 1A includes an optical device 11, a terminal circuit 30, and a variable current source 20A. The terminal circuit 30 and the variable current source 20A form a driver circuit 10-1 of differential input/single-ended output. A drive signal for driving the optical device 11 is output from a node n1 between the terminal circuit 30 and the variable current source 20A. The node n1 is a single output node from which the drive signal for driving the optical device 11 is output.

The variable current source 20A includes a first current source 123, a second current source 124, a switch SW1 connected in series to the first current source 123, a switch SW2 connected in series to the second current source 124, a first bypass circuit 121, and a second bypass circuit 122.

The first bypass circuit 121 is interposed between the switch SW1 and the first current source 123 and has a switch SW3 connected to $V_{DD2}$.

The second bypass circuit 122 is interposed between the switch SW2 and the second current source 124 and has a switch SW4 connected to $V_{DD2}$.

The input signal $V_P$ of the positive phase is input to the switch SW1 and the input signal $V_N$ of the reversed phase is input to the switch SW2. The switch SW3 of the first bypass circuit 121 is turned OFF when the switch SW1 is ON, and is turned ON when the switch SW1 is OFF. The switch SW4 of the second bypass circuit 122 is turned ON when the switch SW2 is OFF, and is turned OFF when the switch SW2 is ON.

The variable current source 20A is configured such that a constant direct current (DC) always flows in the first current source 123 and a constant direct current (DC) always flows in the second current source 124. By supplying a predetermined current to the first current source 123 and the second current source 124 at all times, it is possible to save the time taken to charge the parasitic capacitances of these switches during the ON operation of the switches SW3 and SW4. Therefore, the switches SW1 to SW4 may perform the high-speed switching operation according to the input of the differential data (implementation of the object (a)).

Similarly to the differential input/differential output circuit of FIGS. 1A and 1B, consider a design in which a current of 10 mA flows through the optical device 11 when the input data $V_P$ to the driver circuit 10-1 is at High and a current of 1 mA flows through the optical device 11 when $V_P$ is at Low. A current amount of 11 mA (10 mA+1 mA) required to drive the optical device 11 flows in the $V_{DD}$ side current source.

In FIG. 4A, when $V_P$ is at High, the switch SW1 is turned ON and the switch SW3 of the first bypass circuit 121 is turned OFF. $V_N$ is at Low, the switch SW2 is turned OFF, and the switch SW4 of the second bypass circuit 122 is turned ON. As a result, a current of 10 mA flows from the node n1 between the terminal circuit 30 and the variable current source 20A to the optical device 11, and a current of 1 mA flows to the first current source 123 via the switch SW1. At this time, since the switch SW3 of the first bypass circuit 121 is in the OFF state, no current is supplied from the first bypass circuit 121 to the first current source 123. In the meantime, the switch SW2 to which $V_N$ is input is in the OFF state and a current of 10 mA flows from the second bypass circuit 122 to the second current source 124 via the switch SW4.

In FIG. 4B, when $V_P$ is at Low, the switch SW1 is turned OFF and the switch SW3 of the first bypass circuit 121 is turned ON. $V_N$ is at High, the switch SW2 is turned OFF, and the switch SW4 of the second bypass circuit 122 is turned OFF. As a result, a current of 1 mA flows from the node n1 between the terminal circuit 30 and the variable current source 20A to the optical device 11, and a current of 10 mA flows to the second current source 124 via the switch SW2. At this time, the switch SW3 of the first bypass circuit 121 is in the ON state, and a current of 1 mA flows from the first bypass circuit 121 to the first current source 123. In the meantime, since the switch SW4 of the second bypass circuit 122 is in the OFF state, no current is supplied from the second bypass circuit 122 to the second current source 124.

With this configuration, a current of 1 mA always flows in the first current source 123, and a current of 10 mA always flows in the second current source 124. The switches SW1 to SW4 may be switched at a high speed according to the input data.

The current consumption of the driver circuit 10-1 is as follows: consumption current: 11 mA+10 mA=21 mA when $V_P$=High, and the current consumption: 11 mA+1 mA=12 mA when $V_P$=Low. Where, 11 mA is the amount of current supplied to the $V_{DD}$ side current source, 10 mA is the amount of current caused to flow in the second bypass circuit 122 when $V_P$=High, and 1 mA is the amount of current caused to flow in the first bypass circuit 121 when $V_P$=Low.

Assuming that the probability of an occurrence of High and Low of the input data pattern is 50%, respectively, the average consumption current of the driver circuit 10-1 is 16.75 mA (=21 mA×0.5+12 mA×0.5).

This corresponds to about 58% of the current consumption 29 mA of the differential input/differential output driver of FIGS. 1A and 1B. With the differential input/single-ended output configuration of the First Embodiment, it is possible to reduce the current consumption by 40% or more.

Second Embodiment

Figure 5A:
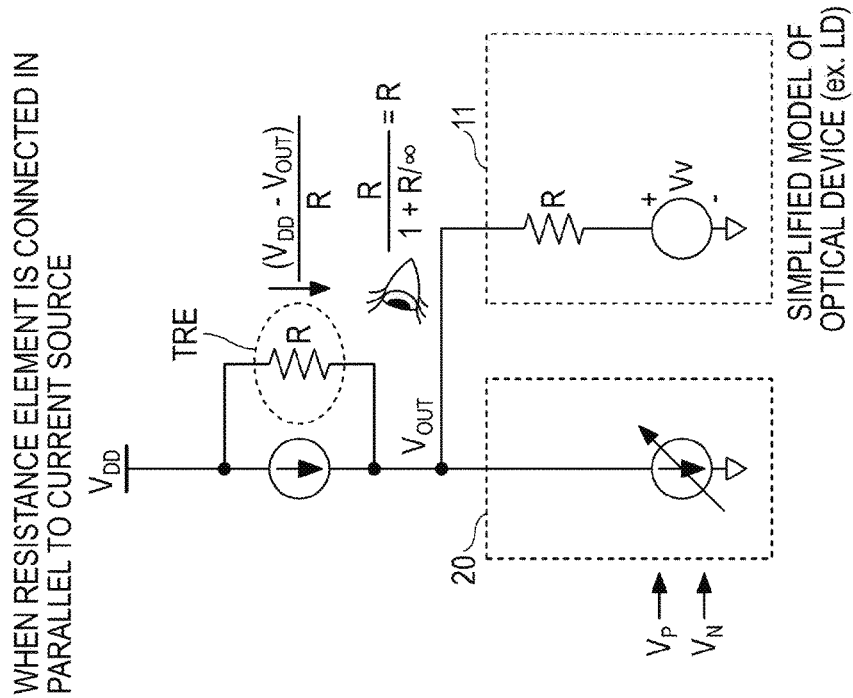
FIGS. 5A and 5B are views for explaining the object of termination in a single-ended output driver.
Figure 5B:
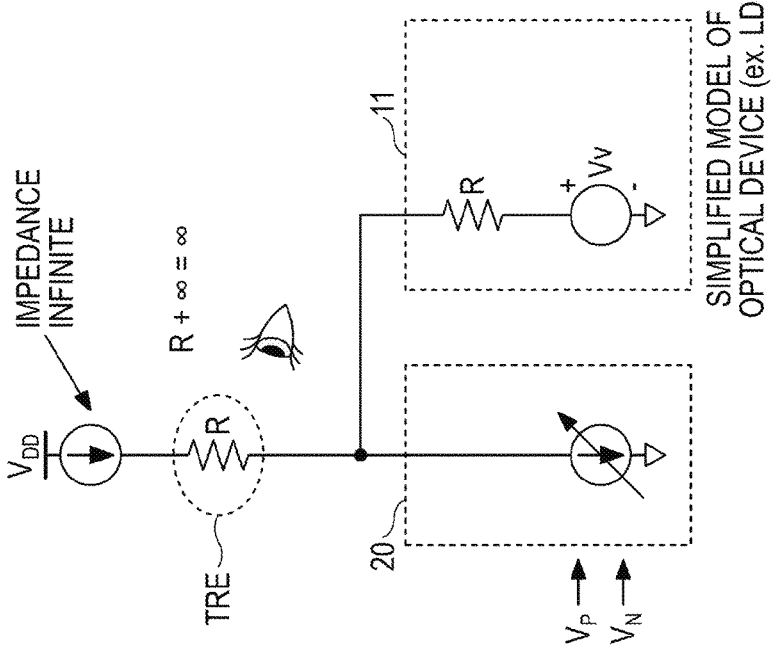

FIGS. 5A and 5B are views for explaining the object (b) of termination in a single-ended output driver. The impedance of the $V_{DD}$ side current source seen from the optical device 11 is made infinite. As illustrated in FIG. 5A, when a terminating resistance element TRE is inserted in series with the current source, the impedance becomes infinite and cannot be terminated. As illustrated in FIG. 5B, when a terminating resistance element TRE having a resistance value R is inserted in parallel with the $V_{DD}$ side current source, the impedance becomes $(1/\infty+1/R)^{-1}=R$ and can be terminated. However, since a current $(V_{DD}-Vout)/R$ due to a potential difference $(V_{DD}-Vout)$ flows through the terminating resistance element TRE, it needs to be controlled in association with the variable current source 20.

Figure 6:
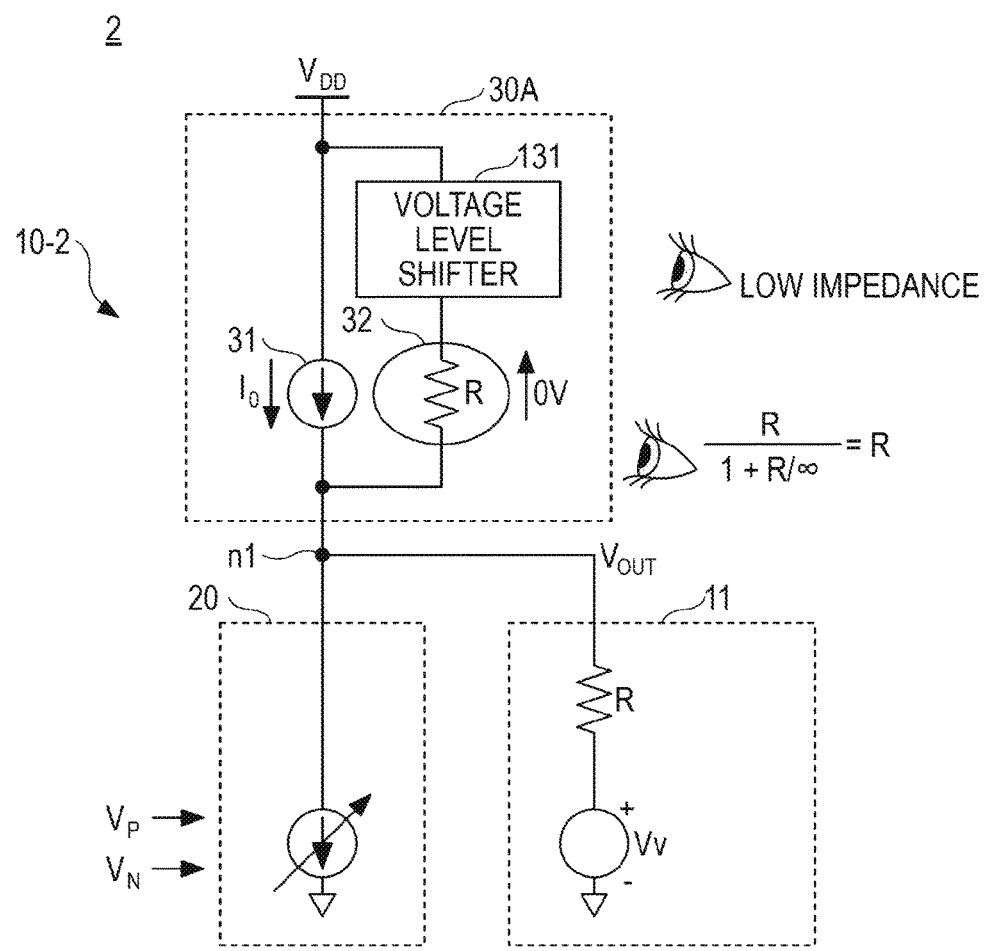
FIG. 6 is a schematic view of an E/O converter of a Second Embodiment.

FIG. 6 illustrates a configuration example of an E/O converter 2 according to a Second Embodiment. The E/O converter 2 includes an optical device 11, a variable current source 20, and a terminal circuit 30A. The variable current source 20 and the terminal circuit 30A form a differential input/single-ended output driver circuit 10-2.

The terminal circuit 30A includes a resistance element 32 connected in parallel with a current source 31 with respect to $V_{DD}$, and a low impedance voltage level shifter 131 connected in series with the resistance element 32 between $V_{DD}$ and the resistance element 32. When a potential difference between both ends of the resistance element 32 can be made zero, no current flows in the resistance element 32.

When the voltage level shifter 131 has impedance lower than a resistance value R when seen from the resistance element 32 of the driver circuit 10-2, the terminating resistance value as seen from the output Vout of the driver circuit 10-2 is determined only by the resistance value R of the resistance element 32.

Figure 7:
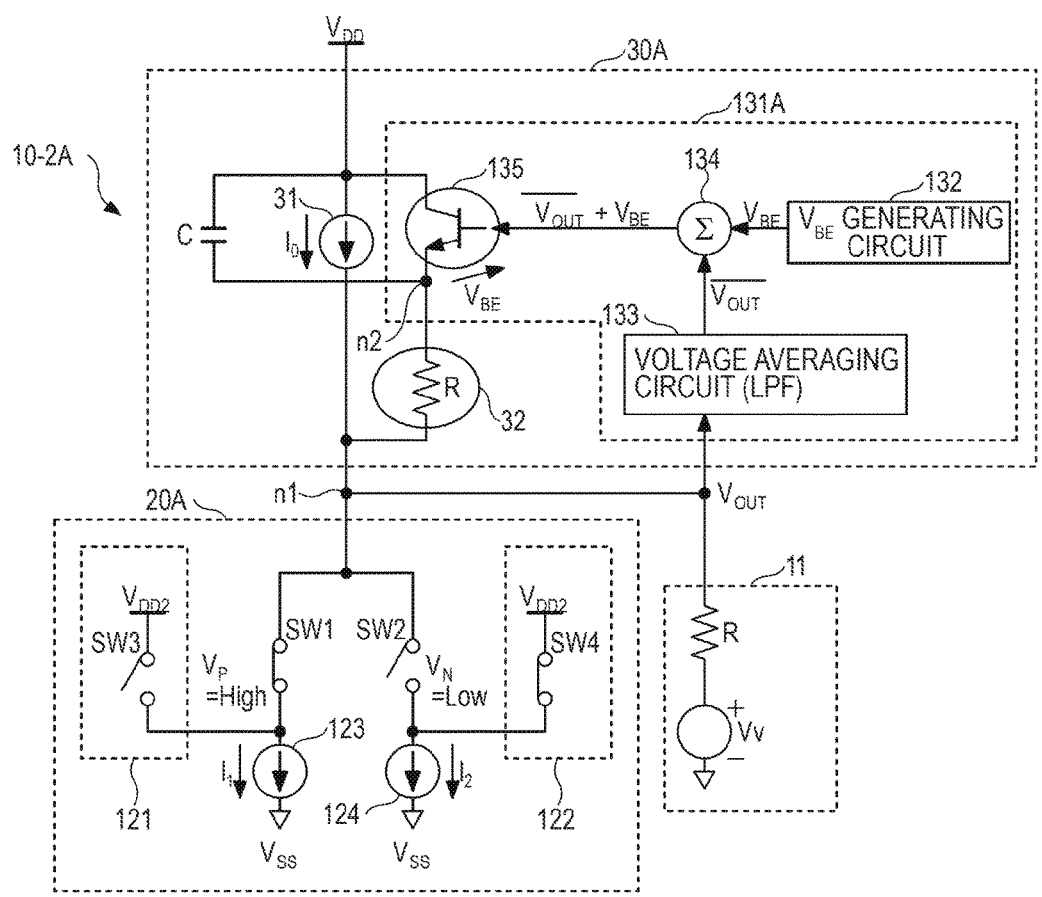
FIG. 7 is a schematic view of an E/O converter including a specific configuration of a voltage level shifter.

FIG. 7 illustrates an E/O converter 2A including a specific configuration of the voltage level shifter 131. The E/O converter 2A includes an optical device 11, a variable current source 20A, and a terminal circuit 30A. The variable current source 20A and the terminal circuit 30A form a driver circuit 10-2A.

The variable current source 20A corresponds to the current source described in the First Embodiment and includes a first bypass circuit 121 and a second bypass circuit 122. A single-ended output Vout is taken out from a node n1 between the terminal circuit 30A and the variable current source 20A, and is input to the optical device 11.

The terminal circuit 30A includes a current source 31, a resistance element 32, a voltage level shifter 131A, and a capacitance C. The resistance element 32 is connected in parallel to the current source 31. The voltage level shifter 131A is connected between the resistance element 32 and $V_{DD}$.

The voltage level shifter 131A includes a transistor 135 connected in series with the resistance element 32, a voltage generating circuit 132, a voltage averaging circuit 133, and an integrator 134. The collector of the transistor 135 is connected to $V_{DD}$ and the emitter thereof is connected to the resistance element 32. The transistor 135 functions as a collector grounded circuit or an emitter follower.

The voltage generating circuit 132 generates a voltage $V_{BE}$ for turning ON the transistor 135. The voltage averaging circuit 133 is, for example, a low pass filter (LPF) and smooths an output voltage Vout of the driver circuit 10-2A. The integrator 134 cumulatively adds the smoothed output voltage Vout and the ON voltage $V_{BE}$ output from the voltage generating circuit 132. A voltage obtained by adding an average value of a driver output and the ON voltage $V_{BE}$ is applied to the base of the transistor 135.

A voltage at a node n2 between the emitter of the transistor 135 and the resistive element 32 becomes the average voltage of the output voltage Vout of the driver circuit 10-2A. By setting the voltage at the node n2 to an average output voltage $\overline{Vout}$, a voltage difference between both ends of the resistance element 32, that is, between the node n2 and the node n1, is eliminated, thereby preventing a DC current from flowing through the resistance element 32.

The capacitance C is connected in parallel with the transistor 135 as a collector grounded circuit. An AC-like current flows via the capacitance C, and a high frequency signal corresponding to the input data is output from the driver circuit 10-2A. With this configuration, it is possible to match the characteristic impedance of the optical device 11 (and the transmission path) with the $V_{DD}$ side impedance and to prevent a direct current from flowing through the resistance element 32. The voltage level shifter 131A may be designed with about several mA and has a small influence on the current consumption of the driver circuit 10-2A.

Third Embodiment

Figure 8:
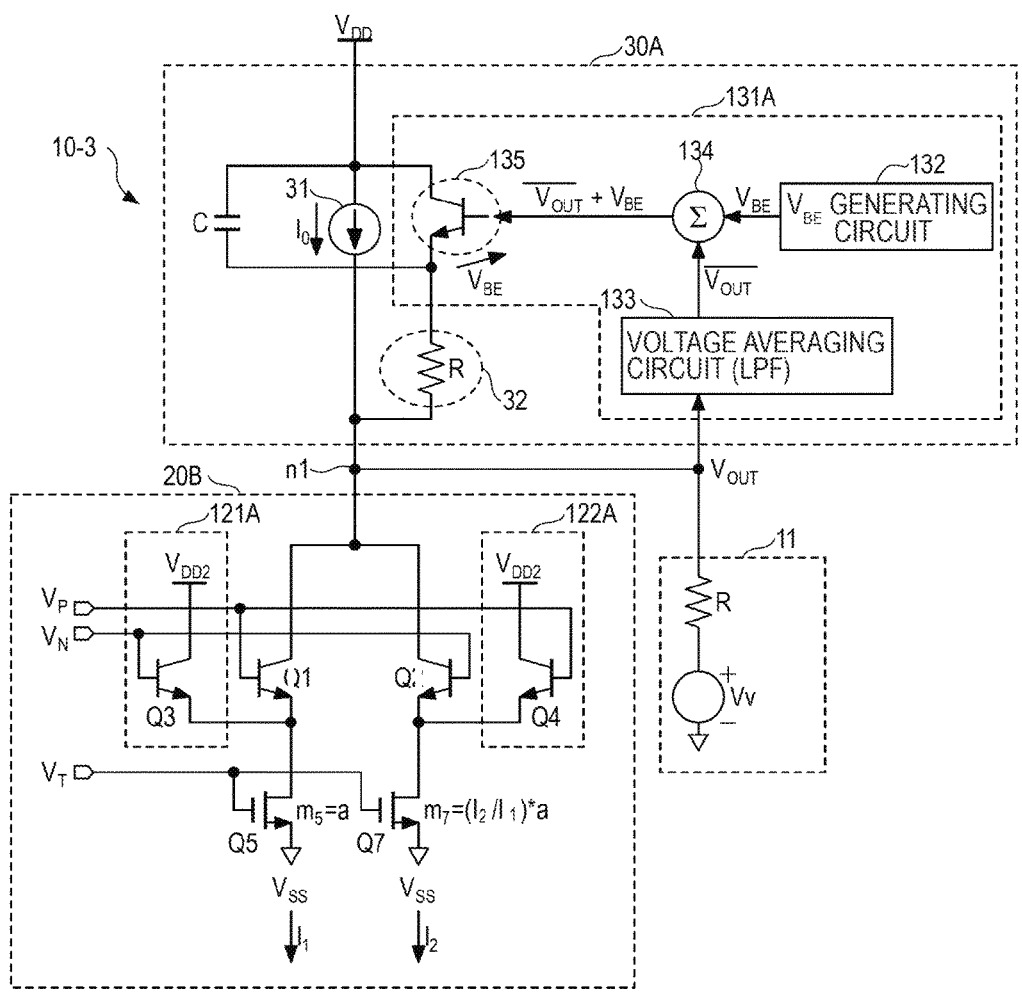
FIG. 8 is a schematic view of an E/O converter of a Third Embodiment.

FIG. 8 is a schematic view of an E/O converter 3 according to a Third Embodiment. The E/O converter 3 includes an optical device 11, a terminal circuit 30A, and a variable current source 20B. The terminal circuit 30A and the variable current source 20B form a differential input/single-ended output driver circuit 10-3. The terminal circuit 30A is the same as the terminal circuit 30A of the Second Embodiment and has a voltage level shifter configuration. The variable current source 20B implements the switch configuration of the variable current source 20A of the First Embodiment with transistors.

The variable current source 20B includes transistors Q1, Q2, Q3, Q4, Q5, and Q7. The base of the transistor Q1 is connected to a $V_P$ signal line and the base of the transistor Q2 is connected to a $V_N$ signal line.

The base of the transistor Q3 of a first bypass circuit 121A is connected to the $V_N$ signal line and the base of the transistor Q4 of a second bypass circuit 122A is connected to the $V_P$ signal line. As a result, the transistor Q3 is turned OFF when the transistor Q1 is turned ON, and is turned ON when the transistor Q1 is turned OFF. Similarly, the transistor Q4 is turned OFF when the transistor Q2 is turned ON, and is turned ON when the transistor Q2 is turned OFF.

The transistors Q5 and Q7 are, for example, MOSFETs, and their gates are connected to a voltage $V_T$. The drain of the transistor Q5 is connected to the collector of the transistor Q1 and the collector of the transistor Q3, and the source thereof is connected to $V_{SS}$. The drain of the transistor Q7 is connected to the collector of the transistor Q2 and the collector of the transistor Q4, and the source thereof is connected to $V_{SS}$.

With this configuration, a constant current $I_1$ always flows through the transistor Q5 and a constant current $I_2$ always flows through the transistor Q7. Therefore, the transistors Q1 to Q4 may perform an ON/OFF operation at a high speed. In the Third Embodiment, the gates of the transistors Q5 and Q7 are connected to the voltage $V_T$ and the parallel degree $m_5$ of the transistor Q5 and the parallel degree $m_7$ of the transistor Q7 are adjusted in order to obtain the desired current $I_1$ and current $I_2$. For example, when the parallel degree $m_5$ of the transistor Q5 that obtains the current $I_1$ flowing through the transistor Q5 is a, the desired current $I_2$ is obtained when the parallel degree $m_7$ of the transistor Q7 is $(I_2/I_1) \times a$.

Fourth Embodiment

Figure 9:
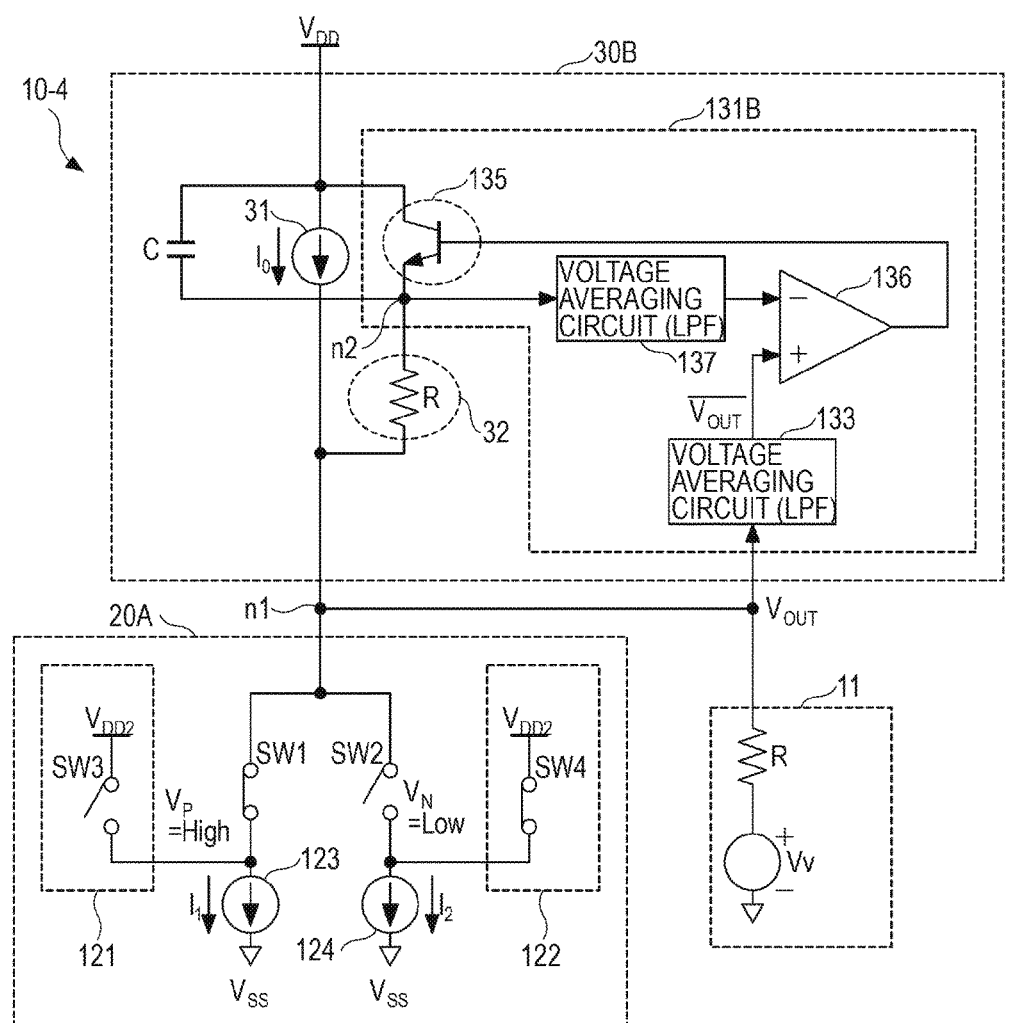
FIG. 9 is a schematic view of an E/O converter of a Fourth Embodiment.

FIG. 9 is a schematic view of an E/O converter 4 according to a Fourth Embodiment. In the fourth embodiment, a voltage level shifter of a terminal circuit is provided with an automatic adjusting function. Specifically, a negative feedback operational amplifier is used to zero a potential difference across a resistor R of the terminal circuit.

The E/O converter 4 includes an optical device 11, a variable current source 20A, and a terminal circuit 30B. A driver circuit 10-4 is formed by the variable current source 20A and the terminal circuit 30B. The variable current source 20A is the same variable current source as in the First Embodiment. A constant current always flows through a current source 123 by a first bypass circuit 121 and a constant current always flows through a current source 124 by a second bypass circuit 122.

The terminal circuit 30B includes a current source 31, a resistance element 32, a voltage level shifter 131B with an automatic adjusting function, and a capacitance C. The resistance element 32 is connected in parallel to the current source 31. The voltage level shifter 131B is connected between the resistance element 32 and $V_{DD}$.

The voltage level shifter 131B includes a transistor 135 connected in series with the resistance element 32, a voltage averaging circuit 133, an operational amplifier 136, and a voltage averaging circuit 137. The collector of the transistor 135 is connected to $V_{DD}$ and the emitter thereof is connected to the resistance element 32, thereby forming a collector grounded circuit or an emitter follower.

The voltage averaging circuit 133 is, for example, a low pass filter (LPF) and smooths the output voltage Vout of the driver circuit 10-4. The other voltage averaging circuit 137 is, for example, a low pass filter (LPF) and smooths a voltage taken out from a node n2 between the emitter of the transistor 135 and the resistance element 32. The output of the voltage averaging circuit 133 is connected to one input terminal (non-inverting input terminal) of the operational amplifier 136. The output of the voltage averaging circuit 137 is connected to the other input terminal (inverting input terminal) of the operational amplifier 136. The output of the operational amplifier, that is, a difference between the two smoothed voltages, is input to the base of the transistor 135. By controlling the difference so as to approach zero, the potential difference across the resistance element R is brought close to zero to prevent a direct current from flowing.

An AC-like current is supplied via the capacitance C connected in parallel with the transistor 135. With this configuration, it is possible to match the impedance on the $V_{DD}$ side with the optical device 11 (and the transmission path) and to prevent a direct current from flowing through the resistance element 32. Since the voltage level shifter 131B operates at a low speed, it consumes a small current. Therefore, the voltage level shifter 131B may be designed with about several mA and has a small influence on the current consumption of the driver circuit 10-4.

Fifth Embodiment

Figure 10:
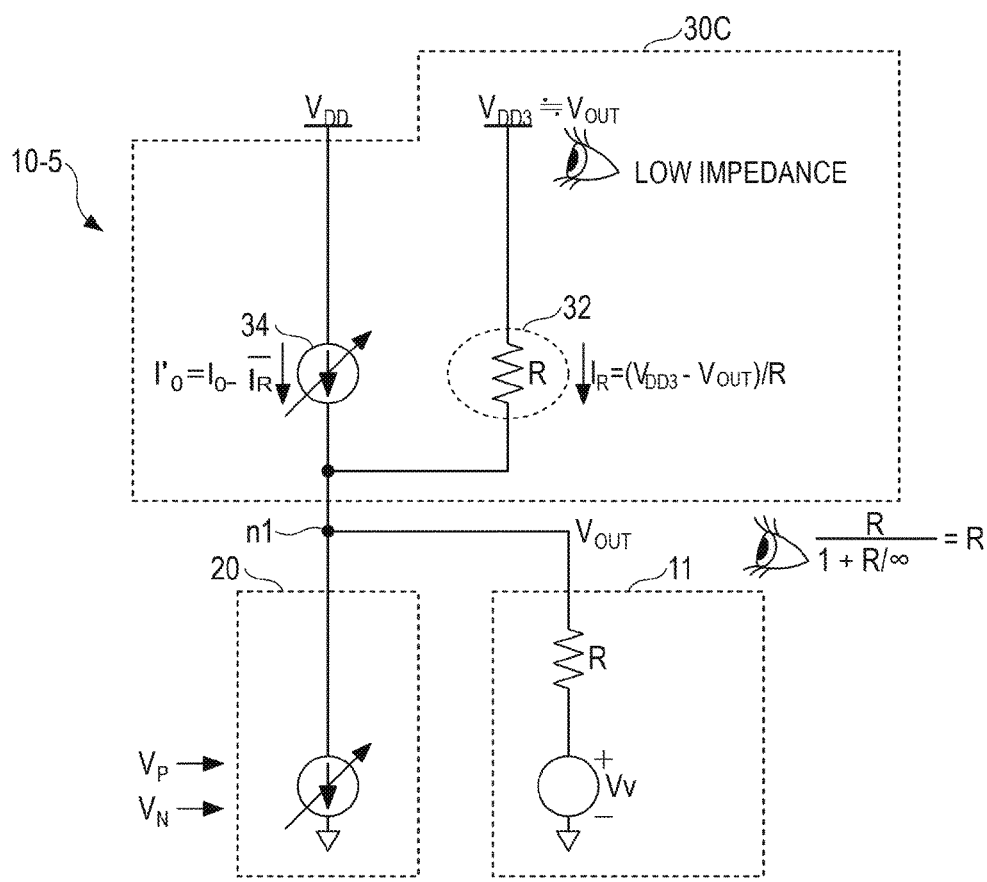
FIG. 10 is a schematic view of an E/O converter of a Fifth Embodiment.

FIG. 10 is a view for explaining another method for achieving the object (b) of termination in the single-ended output driver. In the first and Second Embodiments, the resistance element 32 is connected in parallel with the $V_{DD}$ side current source and the low impedance voltage level shifter is used to prevent a direct current from flowing through the resistance element 32.

In a Fifth Embodiment, the resistance element 32 is connected to another power supply voltage $V_{DD3}$, which has the same level as the amplitude of the output voltage Vout of the driver, to implement low impedance connection. Since the output voltage Vout is a high frequency drive signal which is varied depending on the input data, a current corresponding to a difference between the output voltage Vout and the power supply voltage $V_{DD3}$ flows through the resistance element 32. Therefore, the amount of current flowing through the resistance element 32 is subtracted from a current flowing through the $V_{DD}$ side current source.

An E/O converter 5 of the Fifth Embodiment includes an optical device 11, a variable current source 20, and a terminal circuit 30C. The variable current source 20 and the terminal circuit 30C form a differential input/single-ended output driver circuit 10-5.

The terminal circuit 30C includes a $V_{DD}$ side current source 34 and a resistance element 32. The resistance element 32 is connected to the power supply voltage $V_{DD3}$. The resistance element 32 is connected in parallel to the current source 34 and the resistance value of the resistance element 32 is approximated to R when seen from the optical device 11. Therefore, the impedance of the current source 34 side may be matched with the characteristic impedance of the optical device 11 and the transmission line.

A current $I_R$ corresponding to a difference between $V_{DD3}$ and Vout flows through the resistance element 32. Let the time average of the current $I_R$ be $\overline{I_R}$. When the original current amount of the $V_{DD}$ side current source 34 is $I_0$, a current $I_0{}'$ obtained by subtracting $\overline{I_R}$ from $I_0$ is caused to flow in advance in order to compensate for the variable current $I_R$ flowing through the resistance element 32. As a result, the current amount $I_0$ as designed is supplied to the variable current source 20.

Sixth Embodiment

Figure 11:
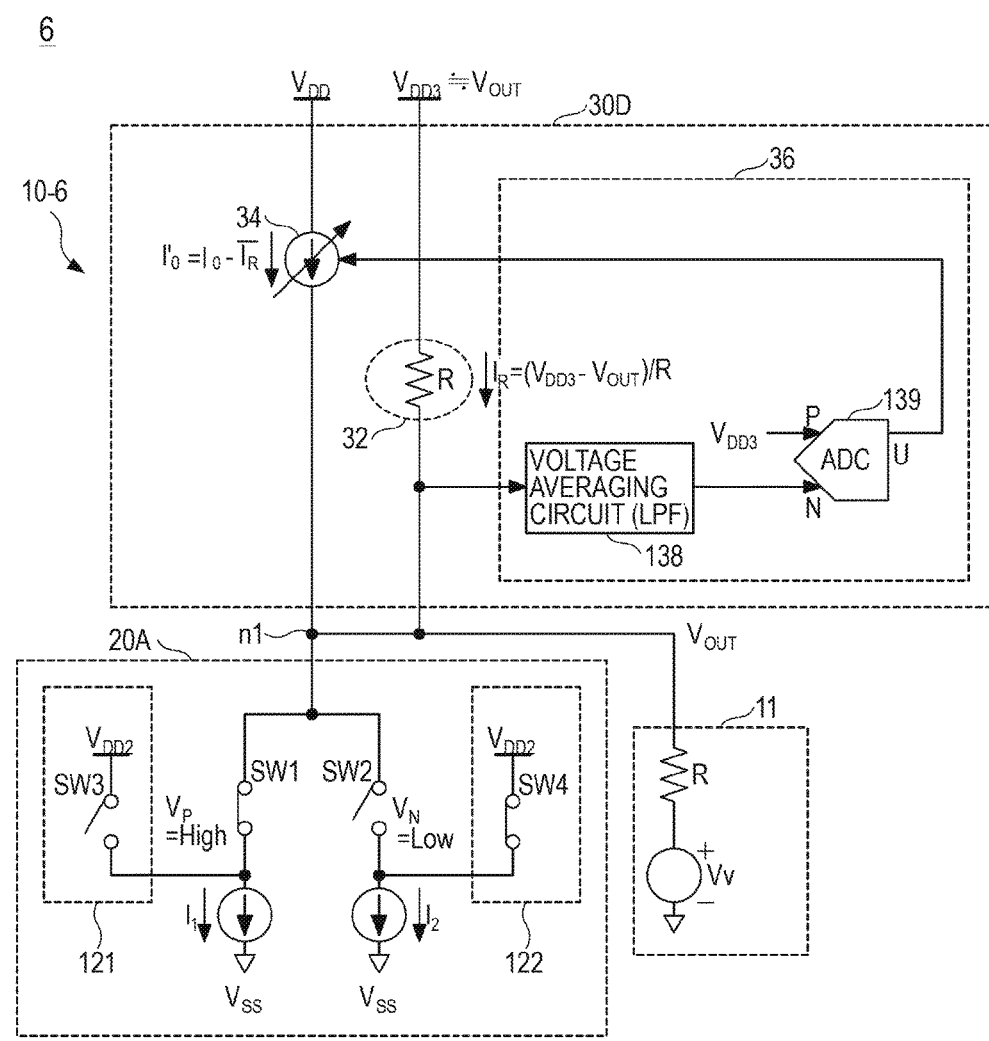
FIG. 11 is a schematic view of an E/O converter of a Sixth Embodiment.

FIG. 11 is a schematic view of an E/O converter 6 of a Sixth Embodiment. In the Sixth Embodiment, the terminal circuit of the configuration of the Fifth Embodiment is provided with an automatic adjusting function. The E/O converter 6 includes an optical device 11, a variable current source 20A, and a terminal circuit 30D. The variable current source 20A and the terminal circuit 30D form a driver circuit 10-6. The terminal circuit 30D includes a current source 34, a resistance element 32, and a current control circuit 36 for controlling the current amount of the current source 34. As in the Fifth Embodiment, the resistance element 32 is inserted in parallel to the current source 34 and is connected to a power supply voltage $V_{DD3}$ which is substantially equal to the output voltage Vout of the driver.

The current control circuit 36 includes a voltage averaging circuit 138 and a differential input ADC 139. The voltage averaging circuit 138 is connected to a node n1 that outputs the single-ended output voltage Vout from the driver, and smooths the voltage of the node n1, that is, Vout. The output of the voltage averaging circuit 138 is connected to one input terminal N of the differential input ADC 139. The other input terminal P of the differential input ADC 139 is connected to the power supply voltage $V_{DD3}$. The differential input ADC 139 digitally outputs a difference between Vout and $V_{DD3}$. The differential digital value is supplied as a current control signal from the output terminal U of the differential ADC 139 to the current source 34. The current source 34 adjusts the current amount according to the input current control signal. Specifically, an amount of current obtained by subtracting the average current amount $\overline{I_R}$ flowing through the resistance element 32 from the original current amount $I_0$ is caused to flow. A current flowing through the variable current source 20A is added to the current $I_R$ flowing through the resistance element 32 to obtain the designed current amount $I_0$. As a result, the current amount is automatically adjusted.

The current control circuit 36 operates at a low speed and may be designed with about several mA. Therefore, the current control circuit 36 has a small influence on the current consumption of the driver circuit 10-6. The voltage $V_{DD3}$ may be set so that $V_{DD3} \approx V_{DD2} \approx \text{Vout}$.

Seventh Embodiment

Figure 12:
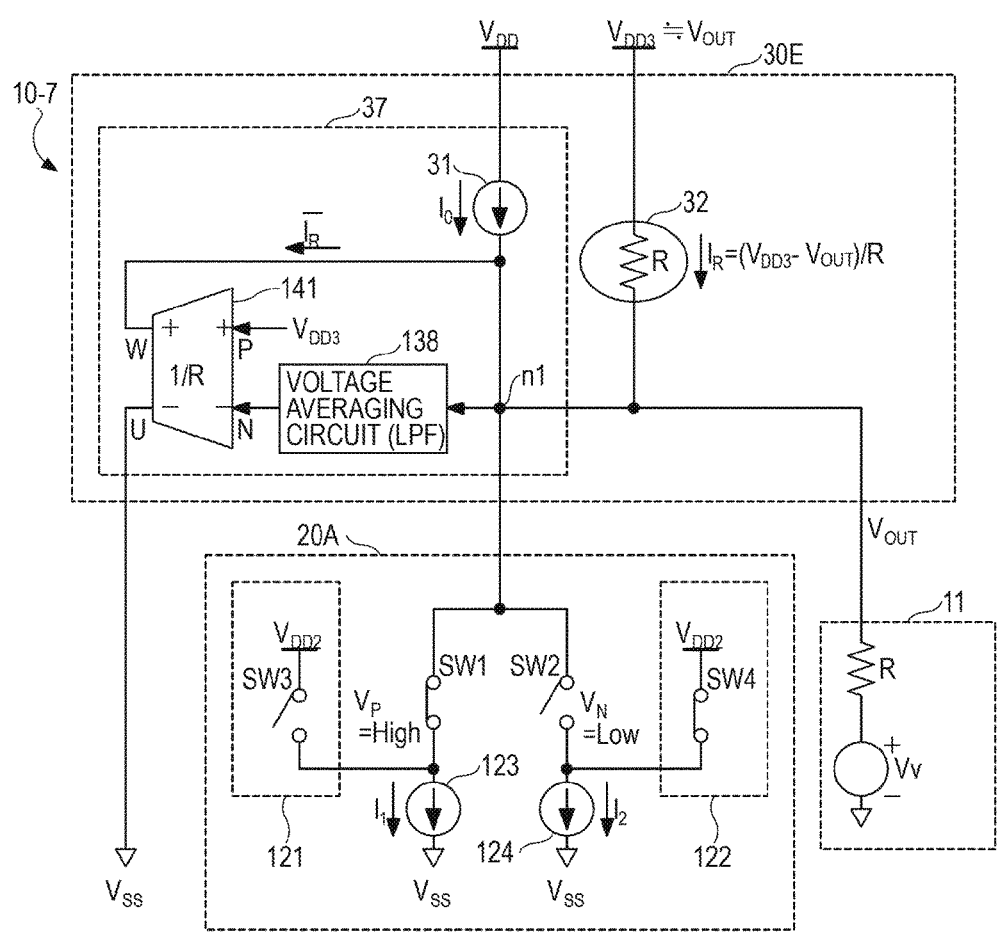
FIG. 12 is a schematic view of an E/O converter of a Seventh Embodiment.

FIG. 12 is a schematic view of an E/O converter 7 of a Seventh Embodiment. The Seventh Embodiment describes another configuration example of the current control circuit for automatically adjusting the current of the terminal circuit.

The E/O converter 6 includes an optical device 11, a variable current source 20A, and a terminal circuit 30E. The variable current source 20A and the terminal circuit 30E form a driver circuit 10-7. The terminal circuit 30E includes a current source 31, a resistance element 32, and a current control circuit 37 for controlling the current amount of the current source 31. The resistance element 32 is inserted in parallel to the current source 31 and is connected to a power supply voltage $V_{DD3}$ which is substantially equal to the output voltage Vout of the driver.

The current control circuit 37 includes a voltage averaging circuit 138 and a transconductance amplifier 141. The voltage averaging circuit 138 is connected to a node n1 from which the output Vout is taken out, and smooths Vout. The output of the voltage averaging circuit 138 is connected to one input terminal N of the transconductance amplifier 141. The other input terminal P of the transconductance amplifier 141 is connected to the power supply voltage $V_{DD3}$. The transconductance amplifier 141 voltage/current-converts a potential difference ΔV between the power supply voltage $V_{DD3}$ and the average voltage of the output voltage Vout with mutual conductance (gm)=1/R. One output terminal W of the transconductance amplifier 141 is connected to the node n1, the other output terminal U thereof is connected to a power supply voltage $V_{SS}$, and a differential current flows from the node n1 to $V_{SS}$.

The current source 31 supplies a constant current $I_0$. However, following the current $I_R$ flowing through the resistance element 32, an average current $\overline{I_R}$ branches from the node n1 to $V_{SS}$. Therefore, the amount of current flowing from the node n1 to the variable current source 20A is $I_0 - \overline{I_R} = I_0'$. In the meantime, since the current $I_R$ flowing through the resistance element 32 joins $I_0'$, the amount of current supplied to the variable current source 20A and the optical device 11 becomes the designed current amount $I_0$. As a result, the current amount is automatically adjusted.

The current control circuit 37 may be designed with about several mA and has a small influence on the current consumption of the driver circuit 10-7.

[Application to Optical Transmission Device]

Figure 13:
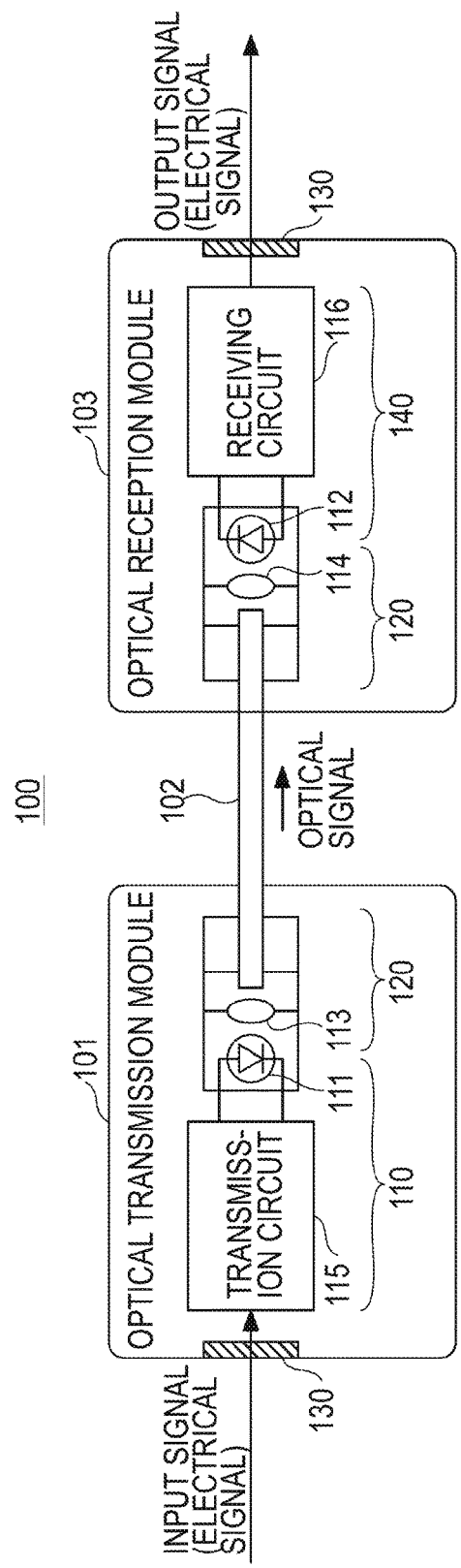
FIG. 13 is a schematic view of an optical transmission device to which an E/O converter of an embodiment is applied.

FIG. 13 is a schematic view of an optical transmission device 100 as an example to which the E/O converter of the embodiment is applied. The optical transmission device 100 includes an optical transmission module 101, an optical reception module 103, and an optical fiber 102 connecting between them. The optical transmission device 100 is used, for example, as an optical transmission cable connecting between computers.

The optical transmission module 101 includes an E/O converter 110, an optical system 120, and a connector 130. The connector 130 is an electrical connector and connects input data (electrical signal) from a computer, LSI, etc. to a transmission circuit 115.

The E/O converter 110 includes a light emitting element 111 and a transmission circuit 115. The transmission circuit 115 includes a differential input/single-ended output driver circuit 10 for driving the light emitting element 111. Data are input to the transmission circuit 115 having the driver circuit 10 via the connector 130. Any one of the driver circuits 10-1 to 10-7 of the first to Seventh Embodiments may be used as the driver circuit 10. The light emitting element 111 is driven by an output signal from the driver circuit 10. The light emitting element 111 may be mounted on a mount with a temperature adjusting function. The light emitting element 111 and the transmission circuit 115 may be connected by wire bonding or the like.

The optical system 120 includes a lens 113 for coupling light, which is output from the light emitting element 111, to the optical fiber 102. The optical system 120 may include a prism, a mirror, etc. instead of the lens 125.

An optical signal transmitted through the optical fiber 102 is received in the optical reception module 103. The optical reception module 103 includes an optical system 120, an O/E converter 140, and a connector 130. The O/E converter 140 includes a light receiving element 112 and a receiving circuit 116.

The optical system 120 includes a lens 114 for coupling light propagating through the optical fiber 102 to the light receiving element 112. The light receiving element 112 outputs a photocurrent corresponding to the amount of received light. The receiving circuit 116 includes a transimpedance amplifier for converting the photocurrent into a voltage signal. The voltage signal is output from the connector 130 to another computer, LSI, or the like.

In the optical transmission module 101, since the light emitting element 111 is driven by using a differential input/single-ended output driver circuit, high speed driving with low current consumption is possible. With the single-ended output configuration, the impedance mismatch between the signal source and the light emitting element 111/the transmission line is terminated, and efficient electrical transmission is performed from the transmission circuit 115 to the light emitting element 111.

Figure 14:
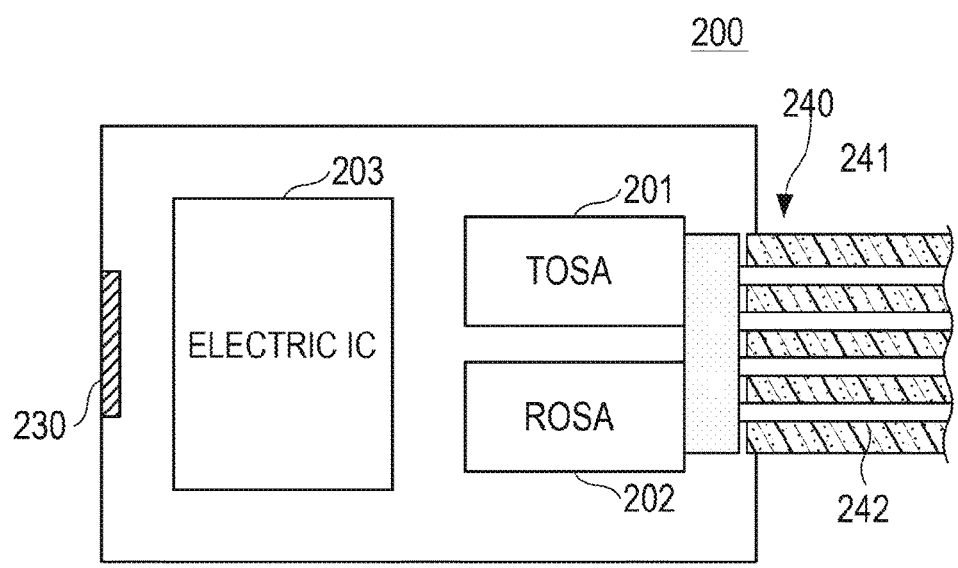
FIG. 14 is a schematic view of an optical transceiver module using an optical transmission module of the embodiment.

FIG. 14 illustrates an optical transceiver module 200 with an optical cable connector 240 as another example of the optical transmission device. The optical transceiver module 200 includes a transmission optical sub-assembly (TOSA) 201, a receiver optical sub-assembly (ROSA) 202, and an electric IC 203.

The TOSA 201 includes a laser, an optical modulator, a monitoring photodiode, and the like. The ROSA 202 includes a light receiving element, a TIA, and the like. The electric IC includes the driver circuit 10 of the embodiment, a post-amplification circuit, a microcontroller, and the like. The driver circuit included in the electric IC 203 may be disposed inside the package of the TOSA 201 to form a built-in driver type optical transmission module.

An electrical connector 230 is installed on the side of the electric IC 203 and an optical cable connector 240 is connected to the side of TOSA and ROSA. The optical cable connector 240 has a fiber ribbon 241 in which plural optical fibers 242 are grouped with a covering tape, and performs optical transmission in plural channels.

Another optical transceiver module 200 is connected to the opposite end of the optical cable connector 240. When the connector 230 is fitted with an electrical connector of a device such as a server, a computer, etc., low current consumption and high speed optical communication are performed between devices.

Although the present disclosure has been described above by way of specific embodiments, the present disclosure is not limited to only the embodiments but includes various modifications. For example, all the transistors Q1 to Q7 of the variable current source 20B in FIG. 8 may be formed by field-effect transistors. As the transistor 135 in FIGS. 8 and 9, a field-effect transistor may be used to function as a drain grounded circuit or a source follower. A differential input amplifier of analog output may be used instead of the differential input A/D converter of digital output in the current control circuit 36 in FIG. 11. The terminal circuits 30A to 30E and the variable current sources 20A and 20B of the embodiments may be combined in any way. An optical device to be driven is not limited to a light emitting element such as VCSEI but may be an external single-ended-driven optical modulator. Even in this case, high speed driving with low current consumption is implemented by using the driver circuits of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A driver circuit having a differential input and a single-ended output, the driver circuit comprising:
   a variable current source configured to include:
   a first current source coupled to a first input node to which a first signal is input from an external,
   a second current source coupled to a second input node to which a second signal as an inversion of the first signal is input from the external,
   a first bypass circuit coupled between the first current source and the first input node, the first bypass circuit being switched according to the second signal, and
   a second bypass circuit coupled between the second current source and the second input node, the second bypass circuit being switched according to the first signal; and
   a terminal circuit configured to be terminated for an optical device driven by a drive signal according to the first signal, the drive signal being output from an output node coupled between the terminal circuit and the variable current source.

2. The driver circuit according to claim 1,
   wherein the first bypass circuit is switched to off when a first switch included in the first input node turns to on according to the first signal,
   wherein the second bypass circuit is switched to off when a second switch included in the second input node turns to on according to the second signal,
   wherein the first current source generates a first current independently of the first signal, and
   wherein the second current source generates a second current independently of the second signal.

3. The driver circuit according to claim 2,
   wherein the second current is output from the output node as the drive signal when the first switch turns to on, and
   wherein the first current is output from the output node as the drive signal when the second switch turns to on.

4. The driver circuit according to claim 1,
   wherein the terminal circuit is configured to include:
   a third current source coupled to a first voltage circuit configured to supply a first voltage,
   a resistor arranged parallel to the third current source, and coupled to a second voltage circuit configured to supply a second voltage similar to an average voltage provided by averaging drive signals output from the output node, and
   a current control circuit configured to control a current generated by the third current source according to a current of the resistor.

5. The driver circuit according to claim 4,
   wherein the current control circuit includes a differential circuit configured to include:
   a first input terminal coupled to the second voltage circuit,
   a second input terminal to which the average voltage is supplied, and
   an output terminal configured to output, to the third current source, a control signal for indicating a voltage difference between the first input terminal and the second input terminal.

6. The driver circuit according to claim 1,
   wherein the terminal circuit is configured to include:
   a constant-current source coupled to a first voltage circuit configured to supply a first voltage,
   a resistor arranged parallel to the constant-current source, and coupled to a second voltage circuit configured to supply a second voltage similar to an average voltage provided by averaging drive signals output from the output node, and
   a current control circuit configured to control a constant-current generated by the constant-current source according to a current of the resistor so as to generate a current to other path by branching the constant-current.

7. The driver circuit according to claim 6,
   wherein the current control circuit includes a transconductance amplifier configured to include:
   a first input terminal coupled to the second voltage circuit,
   a second input terminal to which the average voltage is supplied, and
   an output terminal configured to output, to a ground circuit, a current according to a voltage difference between the first input terminal and the second input terminal.

8. The driver circuit according to claim 1,
   wherein the terminal circuit is configured to include:
   a third current source coupled to a first voltage circuit configured to supply a first voltage,
   a resistor arranged parallel to the third current source between the first voltage circuit and the output node, and
   a voltage level shifter coupled to the resister in series at a first voltage circuit side of the resistor, having an impedance lower than the impedance of the resistor, and configured to equalize voltages at both ends of the resistor.

9. The driver circuit according to claim 8,
   wherein the voltage level shifter is configured to include a transistor coupled to the resistor in series at a first power voltage circuit side of the resistor, and
   wherein a voltage to which a voltage of the output node and a threshold voltage of the transistor are added is applied to one of a base and a gate of the transistor.

10. The driver circuit according to claim 8,
    wherein the voltage level shifter is configured to include a transistor coupled to the resistor in series at a first voltage side of the resistor, and
    wherein a negative feedback, to one of a base and a gate of the transistor, of a differential voltage between a voltage of the output port and a voltage between the transistor and the resistor is executed.

11. An optical transmission module comprising:
    a driver circuit configured to include:
    a differential input and a single-ended output,
    a variable current source configured to include:
    a first current source coupled to a first input node to which a first signal is input from an external,
    a second current source coupled to a second input node to which a second signal as an inversion of the first signal is input from the external,
    a first bypass circuit coupled between the first current source and the first input node, the first bypass circuit being switched according to the second signal, and a second bypass circuit coupled between the second current source and the second input node, the second bypass circuit being switched according to the first signal, and a terminal circuit configured to be terminated for an optical device driven by a drive signal according to the first signal, the drive signal being output from an output node coupled between the terminal circuit and the variable current source; and an optical device configured to be driven by the driver circuit.

12. An optical transmission device comprising:

an optical transmission module configured to include:

a driver circuit configured to include:

a differential input and a single-ended output, a variable current source configured to include:

a first current source coupled to a first input node to which a first signal is input from an external, a second current source coupled to a second input node to which a second signal as an inversion of the first signal is input from the external, a first bypass circuit coupled between the first current source and the first input node, the first bypass circuit being switched according to the second signal, and a second bypass circuit coupled between the second current source and the second input node, the second bypass circuit being switched according to the first signal, and a terminal circuit configured to be terminated for an optical device driven by a drive signal according to the first signal, the drive signal being output from an output node coupled between the terminal circuit and the variable current source, and an optical device configured to be driven by the driver circuit;

an optical fiber; and an optical reception module configured to receive an optical signal transmitted from the optical transmission module through the optical fiber.

* * * * *